US008369141B2

(12) United States Patent
Sommer et al.

(10) Patent No.: US 8,369,141 B2
(45) Date of Patent: Feb. 5, 2013

(54) ADAPTIVE ESTIMATION OF MEMORY CELL READ THRESHOLDS

(75) Inventors: Naftali Sommer, Rishon Lezion (IL); Ofir Shalvi, Ra'anana (IL); Uri Perlmutter, Ra'anana (IL); Oren Golov, Hod Hasharon (IL); Eyal Gurgi, Petach Tikva (IL); Micha Anholt, Tel Aviv (IL); Dotan Sokolov, Ra'anana (IL)

(73) Assignee: Apple Inc., Cupertino, CA (US)

( * ) Notice: Subject to any disclaimer, the term of this patent is extended or adjusted under 35 U.S.C. 154(b) by 645 days.

(21) Appl. No.: 12/522,175

(22) PCT Filed: Mar. 11, 2008

(86) PCT No.: PCT/IL2008/000329
§ 371 (c)(1),
(2), (4) Date: Jul. 6, 2009

(87) PCT Pub. No.: WO2008/111058
PCT Pub. Date: Sep. 18, 2008

(65) Prior Publication Data
US 2010/0091535 A1 Apr. 15, 2010

Related U.S. Application Data

(60) Provisional application No. 60/894,290, filed on Mar. 12, 2007, provisional application No. 61/016,824, filed on Dec. 27, 2007, provisional application No. 61/017,177, filed on Dec. 28, 2007.

(51) Int. Cl.
G11C 11/34 (2006.01)
G11C 16/04 (2006.01)
(52) U.S. Cl. ............... 365/185.03; 365/185.24; 365/45; 711/103; 711/E12.008

(58) Field of Classification Search ............. 365/185.03, 365/185.24, 45; 711/103, E12.008
See application file for complete search history.

(56) References Cited

U.S. PATENT DOCUMENTS

| 3,668,631 | A | 6/1972 | Griffith et al. |
|---|---|---|---|
| 3,668,632 | A | 6/1972 | Oldham |
| 4,058,851 | A | 11/1977 | Scheuneman |
| 4,112,502 | A | 9/1978 | Scheuneman |
| 4,394,763 | A | 7/1983 | Nagano et al. |
| 4,413,339 | A | 11/1983 | Riggle et al. |
| 4,556,961 | A | 12/1985 | Iwahashi et al. |
| 4,558,431 | A | 12/1985 | Satoh |
| 4,608,687 | A | 8/1986 | Dutton |
| 4,654,847 | A | 3/1987 | Dutton |

(Continued)

FOREIGN PATENT DOCUMENTS

| EP | 0783754 B1 | 7/1997 |
|---|---|---|
| EP | 1434236 B1 | 6/2004 |

(Continued)

OTHER PUBLICATIONS

U.S. Appl. No. 11/995,814 Official Action dated Dec. 17, 2010.

(Continued)

Primary Examiner — Toan Le
(74) Attorney, Agent, or Firm — Meyertons, Hood, Kivlin, Kowert & Goetzel, P.C.

(57) ABSTRACT

A method for operating a memory (28) that includes a plurality of analog memory cells (32) includes storing data in the memory by writing first storage values to the cells. Second storage values are read from the cells, and a Cumulative Distribution Function (CDF) of the second storage values is estimated. The estimated CDF is processed so as to compute one or more thresholds. A memory access operation is performed on the cells using the one or more thresholds.

47 Claims, 7 Drawing Sheets

U.S. PATENT DOCUMENTS

| | | |
|---|---|---|
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |

| Patent | Type | Date | Inventor |
|---|---|---|---|
| 6,804,805 | B2 | 10/2004 | Rub |
| 6,807,095 | B2 | 10/2004 | Chen et al. |
| 6,807,101 | B2 | 10/2004 | Ooishi et al. |
| 6,809,964 | B2 | 10/2004 | Moschopoulos et al. |
| 6,819,592 | B2 | 11/2004 | Noguchi et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzalez et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzalez et al. |
| 7,177,199 | B2 | 2/2007 | Chen et al. |
| 7,177,200 | B2 | 2/2007 | Ronen et al. |
| 7,184,338 | B2 | 2/2007 | Nagakawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,574,555 | B2 | 8/2009 | Porat et al. |
| 7,590,002 | B2 | 9/2009 | Mokhlesi et al. |
| 7,593,259 | B2 | 9/2009 | Kim |

| Patent/Publication | Date | Inventor |
|---|---|---|
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1* | 2/2006 | Avraham et al. ......... 365/185.24 |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |

| | | |
|---|---|---|
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

UBUNTU Forums, "Memory Stick Failed IO Superblock", posted Nov. 11, 2009.

Super User Forums, "SD Card Failure, can't read superblock", posted Aug. 8, 2010.

U.S. Appl. No. 12/987,174, filed Jan. 10, 2011.

U.S. Appl. No. 12/987,175, filed Jan. 10, 2011.

U.S. Appl. No. 12/963,649, filed Dec. 9, 2010.

U.S. Appl. No. 13/021,754, filed Feb. 6, 2011.

U.S. Appl. No. 12/019,011 Official Action dated Nov. 20, 2009.

Takeuchi et al., "A Multipage Cell Architecture for High-Speed Programming Multilevel NAND Flash Memories", IEEE Journal of Solid State Circuits, vol. 33, No. 8, Aug. 1998.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.
U.S. Appl. No. 12/045,520 Official Action dated Nov. 16, 2010.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed on Jun. 24, 2010.
Wei, L. "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
ONFI, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.

International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 "Data Storage in Analog Memory Cells with Protection Against Programming Interruption" filed Jul. 6, 2009.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
SAS Protocol, "Information Technology—Serial Attached SCSI—2 (SAS-2)", INCITS document T10/1760-D, revision 15a, Feb. 22, 2009.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
US 7,161,836, 01/2007, Wan et al. (withdrawn)

* cited by examiner

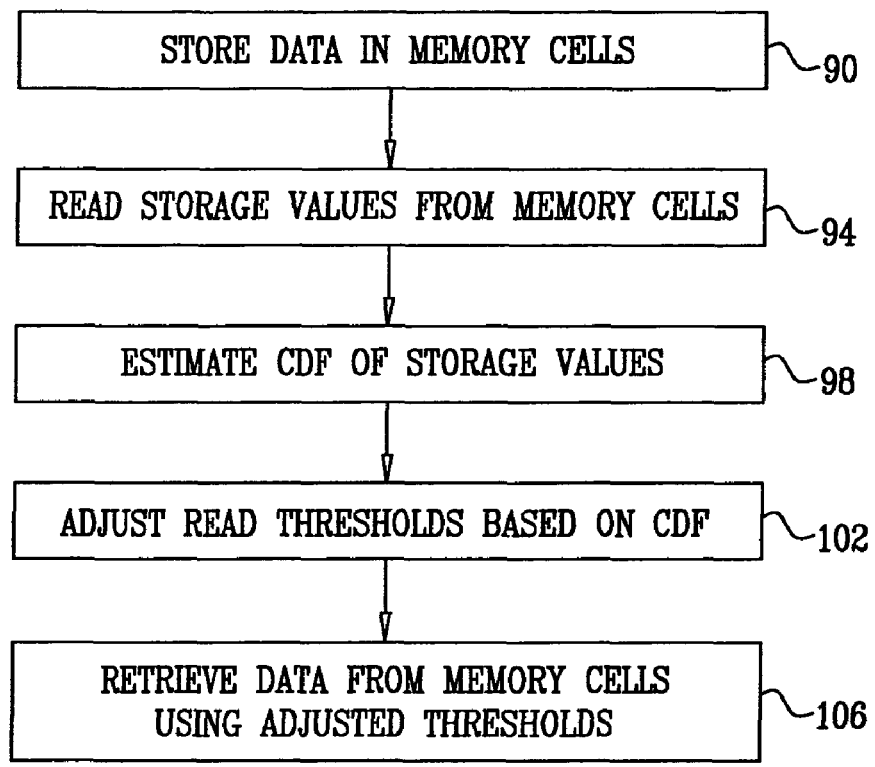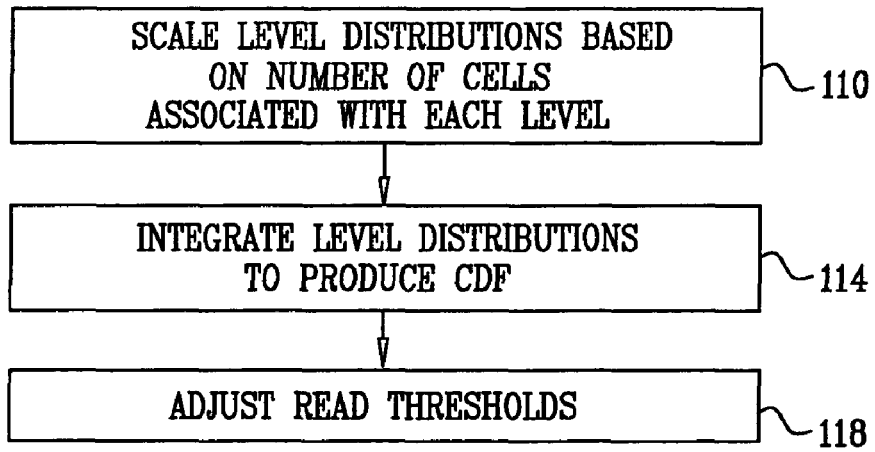

ADAPTIVE ESTIMATION OF MEMORY CELL READ THRESHOLDS

CROSS-REFERENCE TO RELATED APPLICATIONS

This application claims the benefit of U.S. Provisional Patent Application 60/894,290, filed Mar. 12, 2007, U.S. Provisional Patent Application 61/016,824, filed Dec. 27, 2007, and U.S. Provisional Patent Application 61/017,177, filed Dec. 28, 2007, whose disclosures are incorporated herein by reference.

FIELD OF THE INVENTION

The present invention relates generally to memory devices, and particularly to methods and systems for estimating thresholds used in reading data from analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Analog memory cells are typically read by comparing the analog values (storage values) stored in the cells to one or more thresholds, commonly referred to as read thresholds. Several methods for determining read threshold values are known in the art. For example, U.S. Pat. No. 6,751,766, whose disclosure is incorporated herein by reference, describes methods in which the quality of data stored in a memory system is assessed, and the memory system is operated according to the assessed quality. In some embodiments, data storage values are read from the memory. Digital data values are generated according to predefined storage value intervals in which the data storage values lie. The storage value intervals are separated by separation points, which are modified according to the statistics of a plurality of quality indications associated with the read storage values.

U.S. Patent Application Publication 2005/0013165, whose disclosure is incorporated herein by reference, describes methods for reading cells of a Flash memory. The cells are read by determining respective adaptive reference voltages for the cells and comparing the cells' threshold voltages to their respective reference voltages. The adaptive reference voltages are determined either from analog measurements of the threshold voltages of the cells' neighbors, or from preliminary estimates of the cells' threshold voltages based on comparisons of the cells' threshold voltages with integral or fractional reference voltages common to all the cells. Cells of a Flash memory are also read by comparing the cells' threshold voltages to integral reference voltages, comparing the threshold voltages of cells that share a common bit pattern to a fractional reference voltage, and adjusting the reference voltages in accordance with the comparisons.

U.S. Patent Application Publication 2006/0028875, whose disclosure is incorporated herein by reference, describes methods for managing a plurality of memory cells. The cells are managed by obtaining values of one or more environmental parameters of the cells and adjusting values of one or more reference voltages of the cells accordingly. Alternatively, a statistic of at least some of the cells, relative to a single reference parameter that corresponds to a control parameter of the cells, is measured, and the value of the reference voltage is adjusted accordingly. Examples of statistics include the fraction of cells whose threshold voltages exceed initial lower bounds or initial medians.

SUMMARY OF THE INVENTION

Embodiments of the present invention provide a method for operating a memory that includes a plurality of analog memory cells, including:

storing data in the memory by writing first storage values to the cells;

reading second storage values from the cells and estimating a Cumulative Distribution Function (CDF) of the second storage values;

processing the estimated CDF so as to compute one or more thresholds; and performing a memory access operation on the cells using the one or more thresholds.

In some embodiments, estimating the CDF includes computing one or more CDF data points, such that a CDF data point that corresponds to a given storage value is indicative of one of:

a number of the second storage values that do not exceed the given storage value; and a number of the second storage values that exceed the given storage value.

In an embodiment, processing the estimated CDF includes defining a model that produces a target CDF responsively to input parameters, adapting the model by fitting the target CDF to the estimated CDF, and computing the thresholds based on the adapted model. In a disclosed embodiment, the first storage values are selected from a set of nominal values that program the cells to assume respective programming states, and the input parameters include at least one parameter selected from a group of parameters consisting of:

a widening factor of a distribution of a subset of the second storage values associated with one of the programming states;

a variance of the distribution of the subset of the second storage values associated with the one of the programming states;

a relative shift of the distribution of the subset of the second storage values associated with the one of the programming states; and a mean of the distribution of the subset of the second storage values associated with the one of the programming states.

In another embodiment, defining the model includes predefining a plurality of target CDFs, and fitting the target CDF to the estimated CDF includes selecting a predefined target CDF from the plurality responsively to the estimated CDF. In yet another embodiment, the first storage values are selected from a set of nominal values that program the cells to assume respective programming states, the second storage values that are associated with a given programming state are distributed in accordance with a known function of a subset of the input parameters, and adapting the model includes estimating the subset of the input parameters irrespective of programming states other than the given programming state.

In still another embodiment, the first storage values are selected from a set of nominal values that program the cells to assume respective programming states, the model is defined based on a first distribution of the memory cells among the programming states, the CDF is estimated based on a second distribution of the memory cells among the programming states that is different from the first distribution, and adapting the model includes correcting an error in the target CDF caused by a difference between the first and second distributions. In an embodiment, storing the data includes storing information regarding the first distribution in the memory, and correcting the error includes retrieving the stored information and correcting the error responsively to the retrieved information.

In some embodiments, the first storage values are selected from a set of nominal values that program the cells to assume respective programming states, the second storage values corresponding to each of the programming states are distributed in accordance with respective distributions, and estimating the CDF includes scaling the distributions in accordance with numbers of the second storage values that correspond to the respective programming states, and estimating the CDF responsively to the scaled distributions.

In a disclosed embodiment, processing the estimated CDF includes identifying a flat region in the estimated CDF and positioning at least one of the thresholds within the flat region. In another embodiment, the CDF has a known shape within at least a partial range of the second storage values, the estimated CDF has a shift with respect to the CDF, and processing the estimated CDF includes calculating the shift and computing the thresholds responsively to the calculated shift. Estimating the CDF may include measuring one or more values of the CDF in respective one or more of the second storage values that are located in the partial range of the second storage values, and determining the shift based on the measured values of the CDF. Additionally or alternatively, computing the thresholds may include shifting the thresholds with the calculated shift.

In yet another embodiment, the first storage values are selected from a set of nominal values that program the cells to assume respective programming states, the second storage values fall in a set of storage value ranges that correspond to the programming states, and estimating the CDF includes measuring at least one value of the CDF within the storage value ranges.

In still another embodiment, reading the second storage values includes reading the second storage values from a first group of the memory cells, and performing the memory access operation includes performing the memory access operation on a second group of the memory cells, different from the first group, using the one or more thresholds. In an embodiment, the data stored in the first and second groups have first and second data value distributions that are different from one another, and the thresholds are adjusted to match the second data value distribution. In another embodiment, the method includes determining a dependence of optimal threshold positions in the second group on the optimal threshold positions in the first group, and adjusting the thresholds for performing the memory access operation in the second group in accordance with the dependence.

In some embodiments, the one or more thresholds include read thresholds, and performing the memory access operation includes reading third storage values from the cells using the read thresholds, so as to reconstruct the stored data. In an embodiment, storing the data includes encoding the data with an Error Correction Code (ECC), reading the third storage values includes decoding the ECC and determining errors that were corrected by the ECC, and the read thresholds adjusted responsively to the corrected errors.

In another embodiment, for a given read threshold, determining the corrected errors includes determining a first number of the errors caused by the third storage values falling below the given read threshold and a second number of the errors caused by the third storage values falling above the given read threshold, and adjusting the read thresholds includes adjusting the given read threshold responsively to the first and second numbers. Reading the third storage values may include canceling a distortion in one or more of the third storage values.

In some embodiments, the thresholds include verification thresholds, and performing the memory access operation includes verifying the first storage values written to the cells using the verification thresholds. In a disclosed embodiment, storing the data includes encoding the data with an Error Correction Code (ECC), the one or more thresholds include multiple sets of read thresholds, and performing the memory access operation includes reading multiple sets of third storage values from the cells using the respective multiple sets of the read thresholds, computing soft decoding metrics responsively to the multiple sets of the third storage values, and decoding the ECC using the soft decoding metrics, so as to reconstruct the data.

In another embodiment, each of the memory cells stores multiple data bits, storing the data includes storing multiple memory pages in the respective multiple data bits of the memory cells, and performing the memory access operation includes reading each of the memory pages using a subset of the thresholds.

There is additionally provided, in accordance with an embodiment of the present invention, a data storage apparatus, including:

an interface, which is operative to communicate with a memory that includes a plurality of analog memory cells; and a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds.

There is also provided, in accordance with an embodiment of the present invention, a data storage apparatus, including:

a memory, which includes a plurality of analog memory cells; and a processor, which is connected to the memory and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds.

The present invention will be more fully understood from the following detailed description of the embodiments thereof, taken together with the drawings in which:

BRIEF DESCRIPTION OF THE DRAWINGS

FIG. 4 is a flow chart that schematically illustrates a method for data storage and retrieval, in accordance with an embodiment of the present invention;

FIG. 5 is a flow chart that schematically illustrates a method for adjusting read thresholds, in accordance with an embodiment of the present invention;

DETAILED DESCRIPTION OF EMBODIMENTS

Overview

Figure 1:
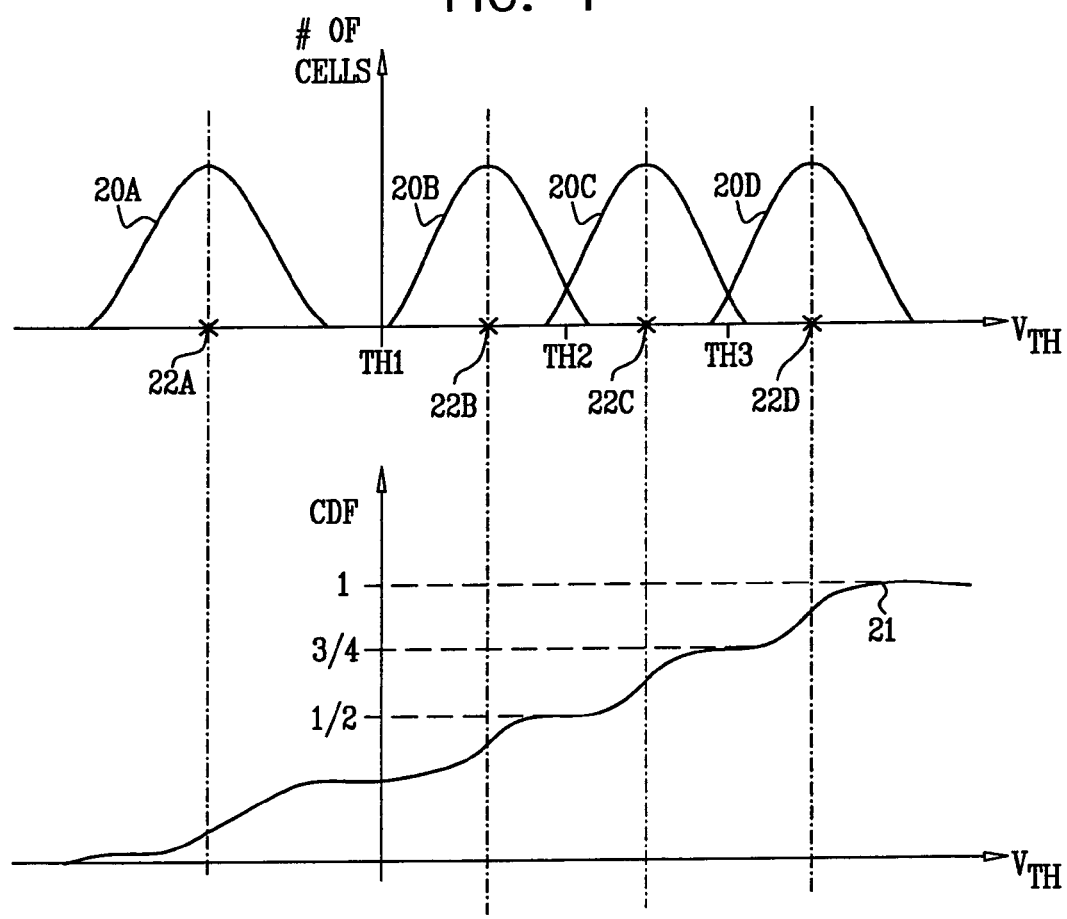
FIG. 1 is a graph showing a distribution and a Cumulative Distribution Function (CDF) of threshold voltages in a group of analog memory cells, in accordance with an embodiment of the present invention.

The optimal values of the read thresholds used for retrieving data from analog memory cells often vary from one cell group to another, as well as over the lifetime of the memory. Accurate positioning of the read thresholds is crucial for maintaining low reading error probability, especially in high-density, multi-level cells.

Embodiments of the present invention provide improved methods and systems for adaptively adjusting the read thresholds used for reading analog memory cells. In accordance with the methods and systems described herein, a Memory Signal processor (MSP) stores and retrieves data in an array of analog memory cells. The MSP estimates the Cumulative Distribution Function (CDF) of the storage values stored in the cells. The CDF is a function whose value, for any given storage value, is indicative of the number of cells (in absolute or relative terms) having storage values less than or equal to the given storage value. The MSP determines the optimal positions of the read thresholds based on the estimated CDF. The MSP adjusts the read thresholds to assume the optimal positions and reads data from the cells using the adjusted thresholds.

Generally, threshold adaptation based on the CDF is superior to adaptation that is based on the storage value distributions themselves, since the CDF can typically be estimated by a much smaller number of data points in comparison with the Probability Distribution Function (PDF).

In some embodiments that are described hereinbelow, the CDF is estimated based on the numbers of cells associated with the different programming levels. In other embodiments, the MSP identifies boundary regions that separate the different programming levels, and positions the read thresholds within the boundary regions. In some methods, the MSP has full or partial a-priori information regarding the distribution of storage values for a given programming level, and the MSP uses this information in computing the read thresholds.

Some of the disclosed methods are model-based. In these methods, the MSP maintains a model that produces a modeled CDF (also referred to as a target CDF) based on a number of input parameters. The MSP adapts the model parameters so as to fit the modeled CDF to the estimated (measured) CDF, and derives the read thresholds from the model. In an alternative embodiment, the model comprises a predefined set of target CDFs, and the MSP selects the target CDF that best fits the measured CDF. In other methods, the MSP encodes the stored data using an Error Correction Code (ECC) and decodes the ECC when retrieving data. The MSP uses information regarding errors that were corrected during ECC decoding in order to adjust the read thresholds. In some embodiments, the read thresholds used for reading a certain group of cells (e.g., a memory page) are adjusted based on CDF measurements that were performed on the same group. In alternative embodiments, CDF measurements are performed on one group of cells, and are used to adjust the read thresholds of another group.

Since the methods and systems described herein continuously track the optimal positions of the read thresholds, the achieved reading performance remains optimal over different cell groups, over the entire lifetime of the memory device, and in the presence of various types of distortion and interference.

Threshold Voltage Distributions and Cumulative Distribution Functions (CDF)

Analog memory cells are programmed to store data by writing storage values (e.g., voltages or currents) to the cells. Although the target storage values that are used for programming the cells are typically chosen from a finite set of nominal values that represent the data, the actual storage values stored in the cells may deviate from the nominal values. These deviations may be caused by several factors, such as inaccuracies in the programming process, drift due to device aging, cell wearing due to previous programming and erasure cycles, disturb noise caused by memory operations applied to other cells in the array and/or cross-coupling interference from other cells. Thus, the storage values of the cells typically have a certain statistical distribution, which may vary from one cell group to another and/or over the lifetime of the memory cells.

(Although the description that follows refers mainly to threshold voltages of Flash memory cells, this choice is made purely for the sake of conceptual clarity. The methods and systems described herein can be used with any other type of storage value used in any other type of analog memory cells.)

FIG. 1 is a graph showing a distribution (upper plot) and a Cumulative Density Function (CDF, lower plot) of threshold voltages in a group of analog memory cells, in accordance with an embodiment of the present invention. In the present example, the cells comprise four-level cells, with each cell storing two data bits. Curves 20A . . . 20D show the distributions of threshold voltages in the group of cells. Each curve corresponds to a subset of the cells that are programmed to a certain programming level or state. Curves 20A . . . 20D show the threshold voltage distributions in the cells that are programmed with target storage values 22A . . . 22D, respectively. In the present example, distribution 20A corresponds to an erased level.

In order to read the data from the cells, the storage values of the cells are compared with read thresholds. In the present example, three read thresholds TH1 . . . TH3 are used to differentiate between the four levels.

A curve 21 shows the Cumulative Distribution Function (CDF) of the threshold voltages in the group of cells. For a given threshold voltage on the horizontal axis, the CDF gives the relative number of cells whose threshold voltage does not exceed the given threshold voltage. Thus, the CDF is zero at the lower edge of the voltage axis, and monotonically increases to reach a value of one at the upper edge of the voltage axis.

In the example of FIG. 1, the same number of cells is programmed to each of the four levels. Thus, the CDF reaches ¼ between the first and second levels, ½ between the second and third levels, and ¾ between the third and fourth levels. Note also that the slope of the CDF is steepest at the middle of distributions 20A . . . 20D, and is substantially flat at the boundary regions in between distributions 20A . . . 20D. Some of the methods described below make use of these characteristics for determining optimal positions (values) of the read thresholds.

System Description

Figure 2:
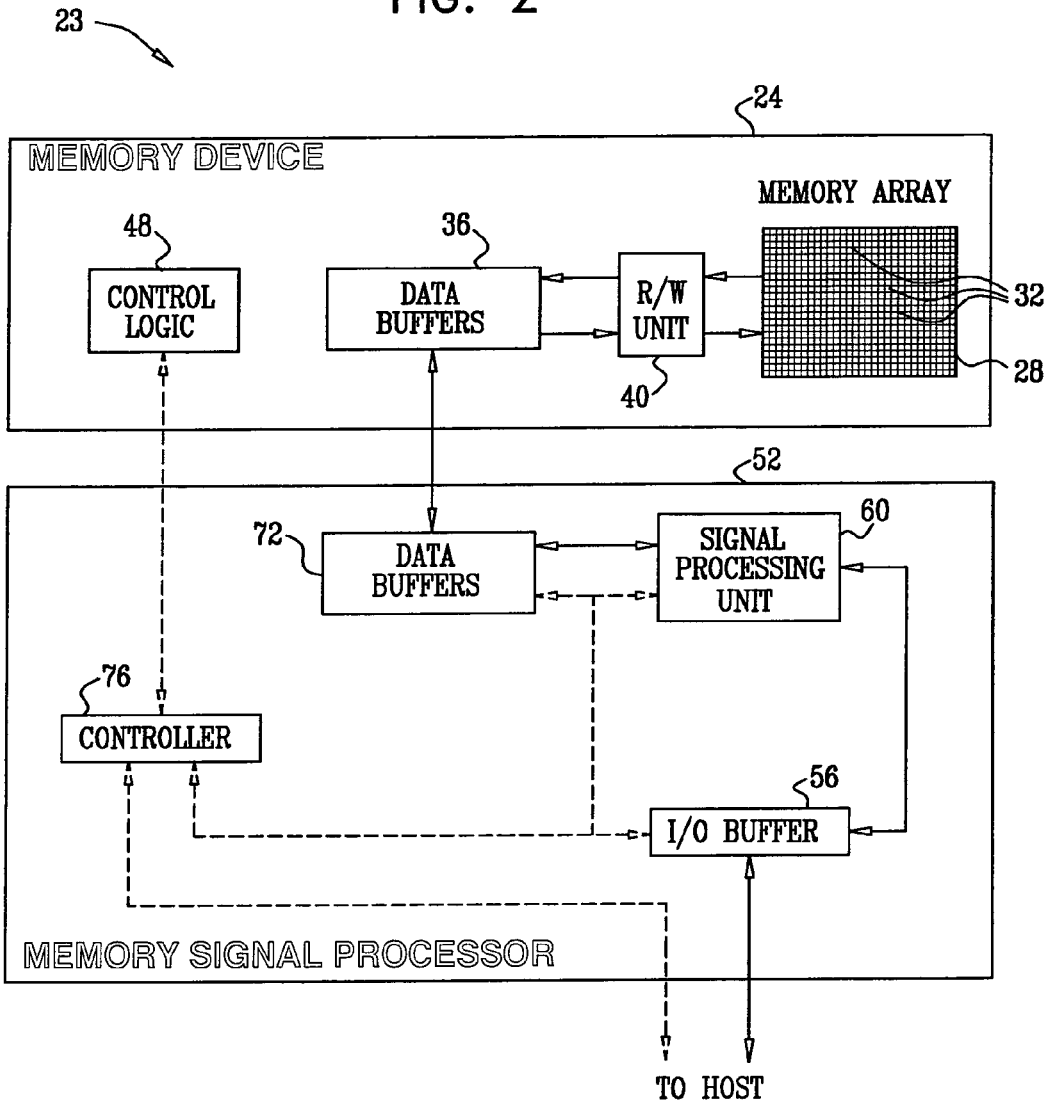
FIG. 2 is a block diagram that schematically illustrates a memory system, in accordance with an embodiment of the present invention.

FIG. 2 is a block diagram that schematically illustrates a memory system 23, in accordance with an embodiment of the present invention. System 23 can be used in various host systems and devices, such as in computing devices, cellular phones or other communication terminals, removable memory modules ("disk-on-key" devices), digital cameras, music and other media players and/or any other system or device in which data is stored and retrieved.

System 23 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge.

Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values or storage values.

System 23 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24. In some embodiments, unit 60 encodes the data to be written into the memory cells using an Error Correction Code (ECC), and decodes the ECC of the retrieved data. Unit 60 may use a Bose-Chaudhuri-Hocquenghem (BCH) code, a Low Density Parity Chack (LDPC) code, or any other suitable type of ECC known in the art. In particular, MSP 52 carries out methods for adaptively adjusting the positions of the read thresholds used for reading data from cells 32, as will be described in detail below.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 2 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 2, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values (storage values) out of the appropriate memory cells 32 and converts them to soft digital samples by comparing the read storage values to the read thresholds. The samples are cached in buffers 36 and transferred to buffers 72 of MSP 52. In some embodiments, unit 60 of MSP 52 converts the samples to data bits and provides the reconstructed data as output.

Figure 3:
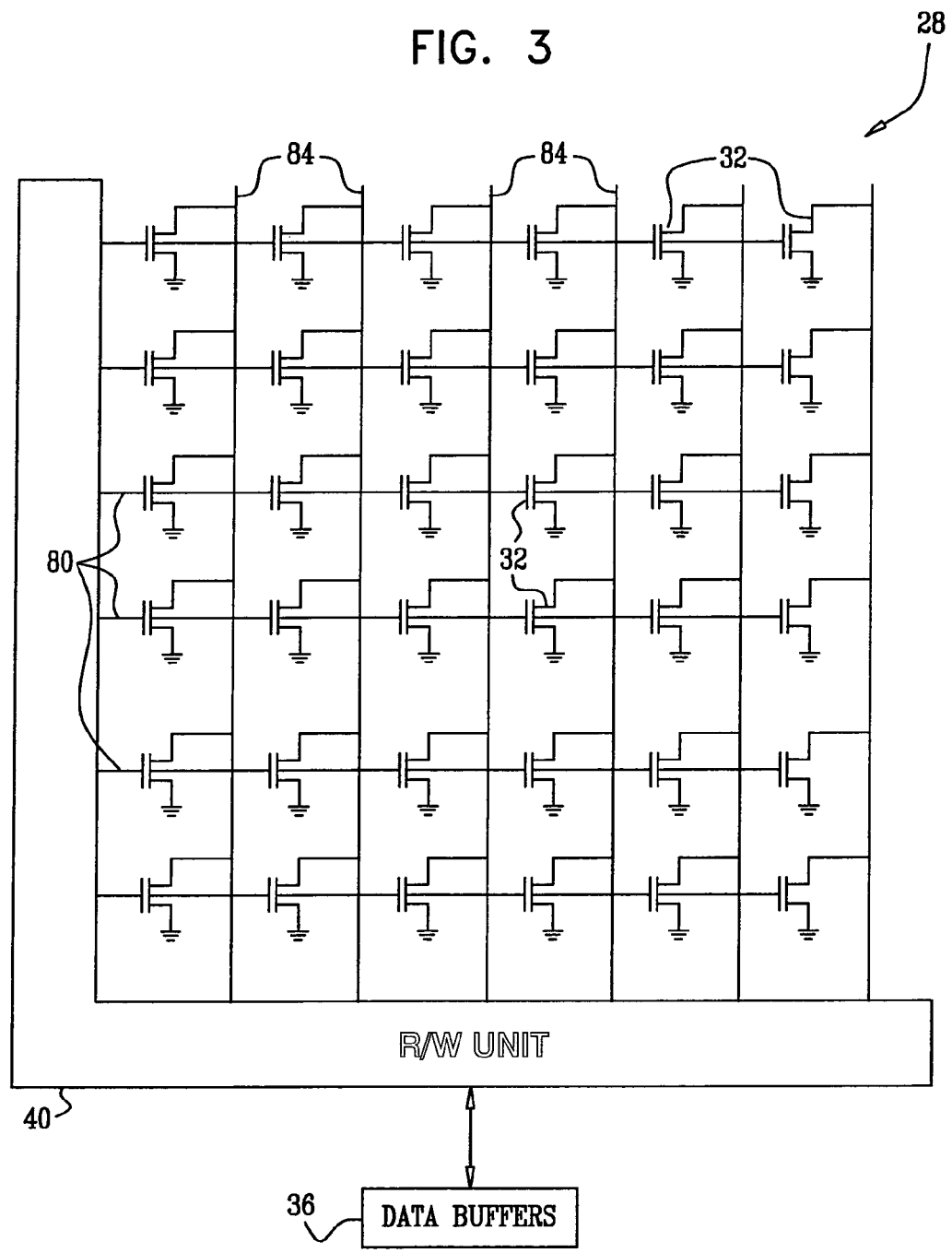
FIG. 3 is a diagram that schematically illustrates a memory cell array, in accordance with an embodiment of the present invention.

FIG. 3 is a diagram that schematically illustrates memory cell array 28, in accordance with an embodiment of the present invention. Although FIG. 3 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In the exemplary configuration of FIG. 3, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

The memory cell array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Read Threshold Estimation Methods

The positions of the read thresholds used for reading the memory cells have a considerable effect on the reading quality, i.e., on the decoding error probability. The read thresholds should be positioned appropriately with respect to the threshold voltage distributions, so that the probability that a read storage value belonging to a certain level will fall on the wrong side of a read threshold is minimized.

Since the threshold voltage distributions of the memory cells vary over the lifetime of the memory cells, it is important to continually track these variations and adjust the threshold positions accordingly. Adaptive setting of read thresholds is particularly important in cells having a large number of programming levels (e.g., eight-level or sixteen-level MLC). In such cells, the different levels are closely-packed on the voltage axis, and voltage distributions often overlap one another given a certain amount of aging and interference. Therefore, the decoding error probability in these cells is highly-sensitive to non-optimal threshold positions.

The methods and systems described herein estimate and adjust the positions of read thresholds, based on the Cumulative Distribution Function (CDF) of the storage values. Threshold estimation and adjustment can be performed at any time and at any frequency, such as in production, during the operational lifetime of the memory device, at periodic intervals, after power-up, as a background low-priority task that operates concurrently with memory access operations, after reading data, after writing data, in response to certain events or conditions, or in accordance with any other suitable logic.

FIG. 4 is a flow chart that schematically illustrates a method for data storage and retrieval, in accordance with an embodiment of the present invention. The description that follows refers to a single page of memory cells. However, the method is applicable to any other suitable group of cells. The method can also be used in an inter-page manner, by using measurements acquired in one page for adjusting the thresholds of another page, as described further below.

The method begins with MSP 52 storing data in a page of memory cells 32 in array 28 by programming the cells with appropriate storage values, at a data storage step 90. At a later time, the MSP is requested to retrieve the data from the memory cells, such as in response to a host command. Data retrieval may be requested at any time, e.g., seconds, hours, days or even years after the data was stored.

In order to retrieve the data with high accuracy, the MSP adjusts the positions of the read thresholds that will be used to read the cells. The MSP reads the storage values (in the present example, the threshold voltages) from the memory cells, at a reading step 94. Typically, the MSP reads the storage values from the entire page in a single read operation. The read operation compares the storage values of the cells in the page to a certain read threshold, and produces indications (hard decisions) as to whether the storage values are smaller or greater than the read threshold.

The MSP estimates the CDF of the threshold voltages of the page, at a CDF estimation step 98. For a given read threshold V, the MSP determines the number N of cells in the page whose threshold voltage is smaller than the threshold. The pair <N,V> forms a single datapoint on the CDF of the threshold voltages of the page. The MSP may estimate the CDF at various accuracy or resolution levels, depending on the number of measured CDF datapoints. In other words, the MSP can improve the CDF estimation by performing a larger number of read operations with different thresholds, and vice versa.

Although the embodiments described herein refer mainly to the estimation, storage and processing of CDFs, the methods and systems described herein can be carried out equivalently by processing inverse CDFs, or $CDF^{-1}$ functions. In the context of the present patent application and in the claims, any reference to the estimation, measurement, storage or any other form of processing of a CDF is meant to refer to the equivalent configuration of $CDF^{-1}$ processing, as well. Typically but not necessarily, processing CDF functions is more efficient in terms of memory usage than processing $CDF^{-1}$ functions. On the other hand, processing $CDF^{-1}$ functions is often more efficient in terms of computational complexity. Thus, the choice between processing CDF and $CDF^{-1}$ functions can be made based on available resources.

The MSP adjusts the positions of the read thresholds based on the estimated CDF, at a threshold adjustment step 102. The MSP sets the read thresholds accordingly and retrieves the data using the adjusted thresholds, at a data retrieval step 106.

In some embodiments, the MSP estimates the CDF over a subset of the storage values read from a given page, (e.g., over the values at the beginning of the page) in order to reduce reading time.

In some MLC devices, multiple memory pages are mapped to a single group of cells, such that each page is mapped to a certain bit. For example, in an eight-level (3 bits/cell) device, a certain page may be stored in the Least Significant Bits (LSB) of the cells, another page may be stored in the Central Significant Bits (CSB) of the cells and yet another page may be stored in the Most Significant Bits (MSB) of the cells.

For example, eight programming levels L1 . . . L8 are mapped to the data bit combinations "111", "011", "001", "101", "100", "000", "010" and "110", in ascending order of storage values. This mapping has a "gray coding" characteristic, in which adjacent programming levels differ from one another by only a single bit. As can be appreciated, the LSB in this case can be read using a single read threshold located between levels L4 and L5. The CSB can be read using two read thresholds, located between levels L2 and L3 and between levels L6 and L7. The MSB can be read using four read thresholds, which are located between levels L1/L2, L3/L4, L5/L6 and L7/L8. In some embodiments, the MSP adjusts some or all of the read thresholds used for reading the data stored in the different MLC bits.

In MLC configurations, the MSP may obtain more than a single CDF data point in a given read operation. In the eight-level configuration above, for example, reading the LSB page obtains one CDF data point, reading the CSB page obtains two additional data points, and reading the MSB page obtains four additional data points. Overall, seven CDF data points are obtained in three read operations.

FIGS. 5-11 below show several exemplary methods for adjusting the read thresholds based on the estimated CDF. Each method makes certain assumptions and has certain advantages and limitations, which are discussed below.

CDF Estimation Using the Number of Cells at Each Programming Level

In some cases, the relative number of cells associated with each programming level is known when the cells are to be read. For example, it can sometimes be assumed that each level has approximately the same number of cells. This condition holds, for example, when the data is scrambled. In other scenarios, the number of cells associated with each level is not the same, but the absolute numbers or ratios between them are known. For example, information indicative of the number of cells in the page that belong to each level can be stored in the page along with the data, or in another area of the memory.

In some embodiments, the MSP estimates the CDF based on the known number of cells associated with each level. The MSP may then adjust the read thresholds based on the estimated CDF, using any of the techniques described herein.

FIG. 5 is a flow chart that schematically illustrates a method for estimating the CDF and adjusting the read thresholds, in accordance with an embodiment of the present invention. The method assumes that the general shape of the storage value distribution (the PDF of the storage values) is known. The method begins with the MSP scaling the magnitude of the PDF of each programming level based on the relative number of cells associated with the level, at a scaling step 110. The output of this step is a set of PDFs, each having a relative magnitude that is proportional to the number of cells associated with the level. In some cases, the number of cells in each individual level is unknown, but the total number of cells in a certain group of levels is known. In such cases, the MSP may assume that the total known number of cells is distributed evenly among the levels in the group.

The MSP integrates the set of PDFs to produce an estimated CDF, at a CDF estimation step 114. The MSP adjusts the read thresholds based on the estimated CDF, at a threshold adjustment step 118. The MSP may adjust the read thresholds using any of the techniques described herein.

In some embodiments, the MSP may estimate the CDF based on the numbers of cells associated with a set of levels, without knowledge of the number of cells in each individual level. For example, when different pages are stored in different MLC bits, the MSP may record the number of "1" data bits in each page, without a need to combine data from different pages. The number associated with each page can be generated independently.

This feature may be used in the other CDF-based methods described herein. Assuming the cells are distributed evenly among programming levels (e.g., when the data is scrambled), the CDF can be estimated without explicit statistics related to individual pages. When the number of cells associated with each programming level (or group of levels) is known, the CDF estimation can be improved, as described above.

Threshold Adjustment for Known Storage Value Distributions

In some cases, the distribution of storage values in a given programming level is known, but its absolute location on the storage value axis is not known. For example, it may be known in advance that the storage value distribution of a particular level is Gaussian and has a certain variance, but the mean of the distribution is unknown. Such a scenario occurs, for example, when each level has a certain known distribution, which has an unknown drift due to aging. In order to position the read thresholds correctly, the absolute position of the storage value distribution should be determined.

Figure 6:
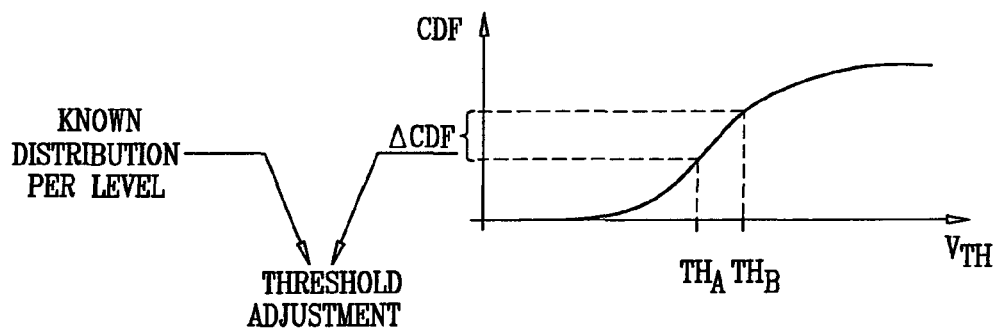
FIG. 6 is a diagram that schematically illustrates a method for adjusting read thresholds, in accordance with an alternative embodiment of the present invention.

FIG. 6 is a diagram that schematically illustrates a method for adjusting read thresholds, in accordance with an alternative embodiment of the present invention. The method of FIG. 6 assumes that the shape of the storage value distribution is known (and therefore the shape of the CDF is known, at least within a partial range of storage values), but its absolute position with respect to the thresholds is unknown. In order to estimate the absolute position of the CDF, the MSP measures two CDF data points (<N,V> pairs, as described above), at two values denoted $TH_A$ and $TH_B$. The difference between the CDF values at these two values is given by $\Delta CDF=CDF(TH_B)-CDF(TH_A)$. For most distributions, since the shape of the CDF is known, the value of $\Delta CDF$ uniquely determines the absolute position of the CDF on the storage value axis.

The MSP determines the absolute position of the CDF (e.g., the mean of the storage value distribution) from the known CDF shape and the two CDF data points. The MSP then adjusts the read thresholds with respect to the known absolute position of the CDF.

The process described above can be repeated for the different programming levels. Thus, for n-level cells, all thresholds can be set by performing 2n read operations, i.e., using 2n CDF data points. (In some cases, a smaller number of CDF data points may suffice. For example, when one of the levels is an erased level, it may not be necessary to estimate its position accurately. In these cases, only 2n–2 read operations are often sufficient. Alternatively, The MSP may verify that the number of bits below TH1 is 1/n of the total number, by performing 2n–1 read operations.)

Further alternatively, the MSP can determine the absolute position of the storage value distribution using a single read operation, assuming the numbers of cells associated with the different levels are known. The MSP may obtain a single CDF data point in the relevant region of a given programming level, and determine the absolute position of the level distribution based on the acquired data point and on the known relative number of cells associated with the respective programming level. The use of multiple CDF data points reduces the sensitivity of the estimation to the number of cells associated with each level, at the expense of additional read operations.

The method above can also be used when the number of cells associated with each programming levels is not known. For example, when the data is scrambled, the MSP may assume that the cells are distributed evenly among the different programming levels.

Threshold Adjustment by Locating Boundaries Between Programming Levels

In some cases, the storage value distributions of the different programming levels are separated by well-defined boundary regions. The number of cells whose storage values fall in the boundary regions is typically very small. Therefore, the CDF of the storage values is typically flat in these regions. The widths and absolute locations of the boundary regions may change over time, for example because of drift and widening of the storage value distributions. In some embodiments, the MSP automatically determines the locations of the boundary regions between programming levels, and positions the read thresholds within these regions.

Figure 7:
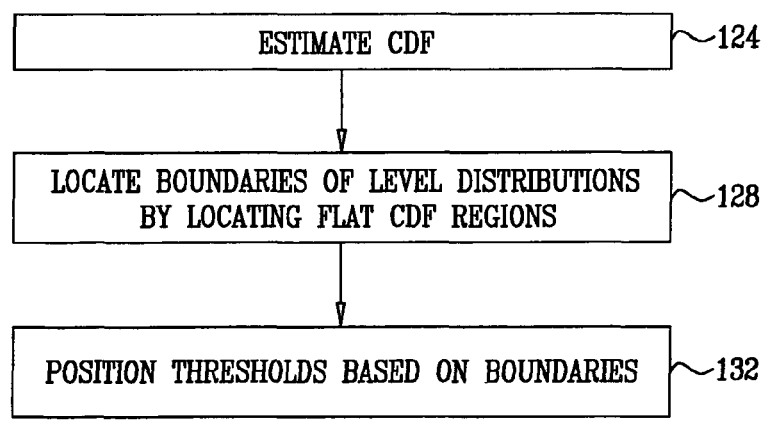
FIGS. 7-11 are flow charts that schematically illustrate methods for adjusting read thresholds, in accordance with alternative embodiments of the present invention.

FIG. 7 is a flow chart that schematically illustrates a method for adjusting read thresholds, in accordance with another embodiment of the present invention. The method begin with the MSP estimating the CDF of the storage values, at a CDF estimation step 124, similarly to step 98 of FIG. 4 above. The MSP determines the boundary regions between adjacent programming levels by detecting flat regions in the estimated CDF, at a boundary detection step 128. (In some cases, the CDF is not entirely flat in the boundary regions, but has a gentle slope. Thus, the term "flat region" also refers to a region whose slope is considerably gentler with respect to other regions.) The MSP positions the read thresholds within the detected boundary regions, at a threshold positioning step 132.

Typically, the MSP positions a single read threshold that differentiates between a pair of adjacent programming levels within the boundary region that separates the two levels. The MSP may select the read threshold values from a set of predetermined threshold values, by selecting values that fall in relatively flat regions of the CDF.

When the shape of the storage value distribution is known (i.e., the shape of the CDF is known, at least within a certain region of storage values), the MSP can reduce the number of read operations performed in CDF estimation step 124 above. For example, for a given boundary region, the MSP can measure a single CDF data point that falls slightly above the boundary region, and derive the upper edge of the boundary region from the known CDF shape. The lower edge of the boundary region can be similarly determined using a single CDF data point falling slightly below the region. Thus, when the CDF shape is known, the MSP can determine the edge of a certain boundary region using only a single read operation (a single CDF data point).

Model-Based Threshold Adjustment

In some embodiments, the MSP defines and maintains a mathematical model that produces a target CDF based on one or more input parameters. The MSP calculates the read thresholds by fitting the target CDF produced by the model to an estimated CDF derived from actual read operations. In particular, the MSP may store a predefined set of target CDFs, and select the target CDF that best fits the estimated (measured) CDF. In this context, the set of target CDFs is also referred to herein as a model.

Figure 8:
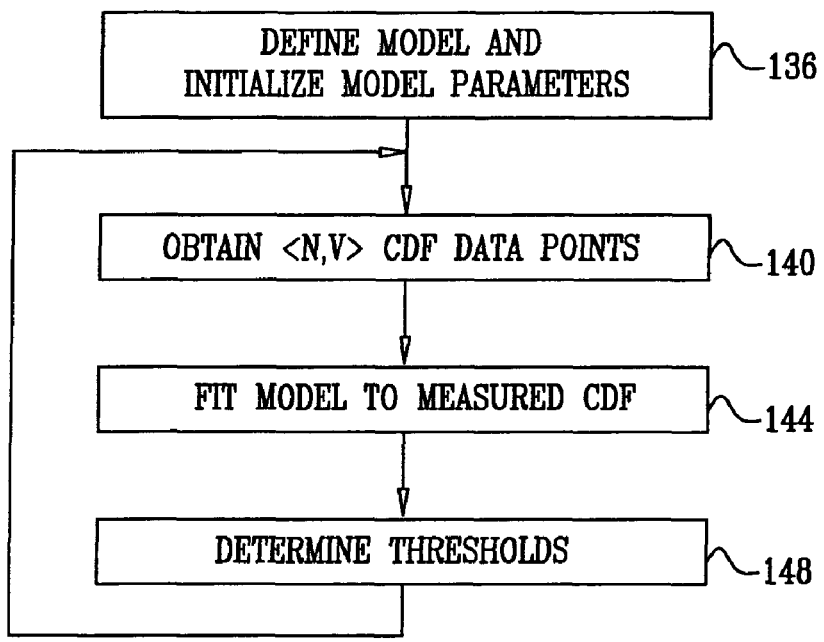

FIG. 8 is a flow chart that schematically illustrates a method for adjusting read thresholds, in accordance with an embodiment of the present invention. The method of FIG. 8 is typically used when the properties of the CDF are not known a-priori. The method begins with the MSP defining a model that produces the target CDF and initializing the model parameters, at a model definition step 136.

In some embodiments, the model accepts as input various parameters of the storage value distributions of the different levels. The input parameters may comprise, for example, an offset (or an absolute position) and/or a scaling factor (shrinking/widening factor) for each of the programming levels. The input parameters may be initially set to the best currently-known values or to any other suitable initial values. In an alternative embodiment, the model comprises a set of several CDFs (referred to as target CDFs), such as CDFs that are typical of various stages along the lifetime of the memory. Such CDFs may reflect, for example, different numbers of programming/erasure cycles that the cells have gone through, different degrees of cell aging or different temperature conditions.

Further alternatively, the target CDFs may reflect different types of distortion that the cells may suffer from. Exemplary distortion estimation methods are described, for example, in PCT Application WO 2007/132453, entitled "Distortion Estimation and Cancellation in Memory Devices," filed May 10, 2007, and in PCT Application PCT/IL2007/001059, entitled "Estimation of Non-Linear Distortion in Memory Devices," filed Aug. 27, 2007, whose disclosures are incorporated herein by reference.

The MSP estimates the actual CDF of the storage values by measuring one or more CDF data points, at a CDF estimation step 140. The MSP fits the model to the estimated (measured)

CDF, at a fitting step 144. Typically, the MSP attempts to estimate the input parameter values (e.g., the offsets and scaling factors of the different programming levels) for which the model produces a target CDF that best fits the estimated CDF. In some embodiments, the MSP may adjust the model based on the numbers of cells that are associated with different programming levels, as described above.

For example, in an eight-level MLC, the model may comprise an offset and a scaling factor for each of the seven non-erased levels, i.e., a total of fourteen parameters. Alternatively, a simpler model may use a smaller set of input parameters by assuming that all levels are subject to the same offset and/or the same scaling factor. Further alternatively, any other suitable model having any suitable set of input parameters can be used. For example, a certain known dependence may exist between the shifts and/or widening factors of the different levels (e.g., the shift of a certain level may be proportional to the central storage value of the level). In such cases, the MSP may use a smaller number of parameters and a smaller number of read operations. When the model comprises a predefined set of target CDFs, the MSP selects the target CDF that best fits the estimated CDF.

The MSP may fit the target CDF to the estimated CDF using a Maximum Likelihood (ML) criterion, as is known in the art, or using any other suitable fitting criterion or metric.

The MSP adjusts the read threshold values based on the fitting results, at a threshold adjustment step 148. For example, the model may produce read threshold values that match the target CDF. When the model comprises a set of target CDFs, a corresponding set of optimal read thresholds may be stored with each target CDF. Alternatively, the MSP may set the read thresholds based on the estimated CDF, using any of the techniques described herein. The method then loops back to step 140 above, and the MSP continues to estimate the actual storage value CDF and fit the model accordingly.

The accuracy of the threshold adjustment process described above depends on the accuracy of the estimated CDF measured at step 140, as well as on the accuracy of the model. The CDF estimation accuracy generally depends on the number and quality of the measured CDF data points, which increases with the number of model fitting iterations. In some cases it is beneficial to obtain additional CDF data points before attempting to adapt the model. Therefore, the MSP may decide, at each iteration of the method of FIG. 8, whether to try and fit the model parameters to the estimated CDF or to obtain additional CDF data points and improve the CDF estimation accuracy.

Further alternatively, the MSP may carry out steps 140 and 144 concurrently. For example, the MSP may perform model fitting calculations on previously-obtained CDF data points, and in parallel obtain additional data points.

Figure 9:
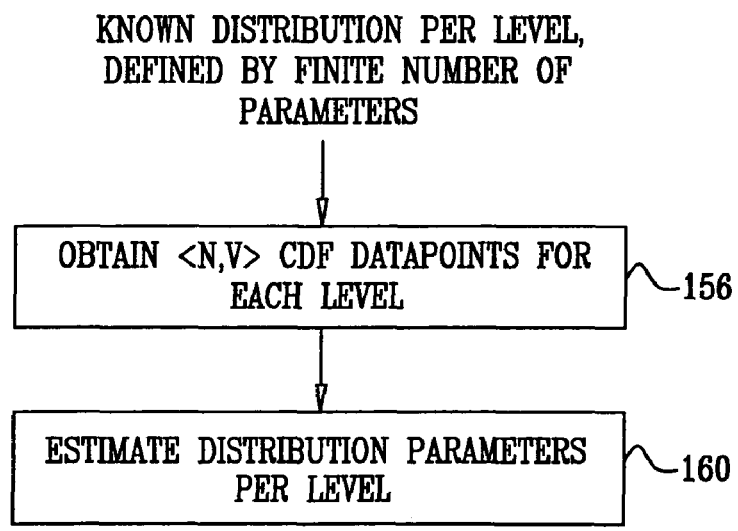

FIG. 9 is a flow chart that schematically illustrates another model-based method for adjusting read thresholds, in accordance with an alternative embodiment of the present invention. The method of FIG. 9 assumes that the distribution of each programming level is known and is defined by a finite number of parameters. For example, in some cases it is known that the storage values in each level have a Gaussian distribution, which can be described using two parameters—the mean and the variance of the distribution.

The method begins with the MSP measuring CDF data points separately for each programming level, at a level-specific measurement step 156. Typically, the number of CDF data points measured per level matches the number of parameters used for representing the known distribution. For example, when each level has a Gaussian distribution, the MSP measures two CDF data points per level. The MSP then estimates the distribution parameters of each level, at a level-specific parameter estimation step 160.

Having estimated the distribution parameters of the different programming levels, the MSP can adjust the read thresholds based on the known CDF, as described above.

The number of measured CDF data points can be reduced when some of the distribution parameters are known, and/or when relationships between some of the distribution parameters can be assumed. For example, when the level distributions are Gaussian having known variances and only unknown offsets, the MSP can adjust the thresholds using only a single CDF data point per level. The number of data points can also be reduced, for example, when all levels can be assumed to have the same offset. Typically, the number of CDF data points can be reduced to the number of independent parameters.

When carrying out the methods of FIGS. 8 and 9, the MSP may use different methods and criteria for determining which CDF data points to measure. In particular, a trade-off exists between measuring CDF data points located in the boundaries between programming levels and data points located inside the levels.

On one hand, the regions of the CDF that lie within the programming levels (CDF data points located within the programming levels) are often extremely valuable to the accuracy of the model, in comparison with data points that lie in boundary regions between programming levels. On the other hand, CDF data points located in the boundaries between levels can be re-used for retrieving data from the cells, whereas data points in the middle of the programming levels can typically be used only for model fitting. The MSP may measure CDF data points in the boundary regions, within the level distributions, or it may measure a combination of both types of data points.

Compensation for Unknown Shift in CDF

In some cases, the actual CDF is known a-priori, with the exception of an unknown shift. Such a scenario occurs, for example, as a result of temperature variations or when aging effects cause similar shifts in all levels.

Figure 10:
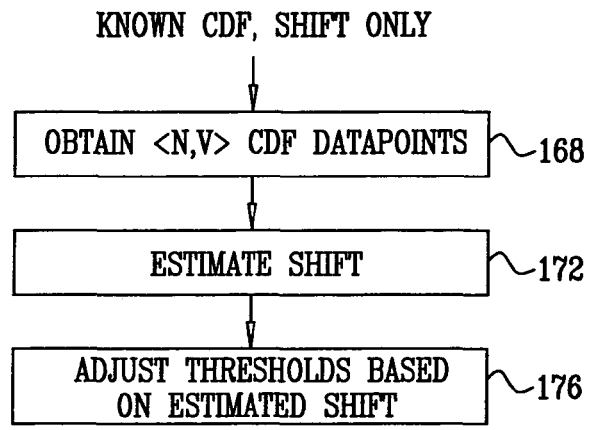

FIG. 10 is a flow chart that schematically illustrates a method for adjusting read thresholds, in accordance with another embodiment of the present invention. The method of FIG. 10 assumes that the CDF is known except for an unknown shift. The method can also be used when other unknown factors exist, but the shift is dominant. For example, when the CDF is subject to both shift and scaling, scaling may sometimes be neglected for small shift values.

The method begins with the MSP measuring one or more CDF data points, at a CDF measurement step 168. The MSP estimates the shift of the actual CDF from the measured data points, at a shift estimation step 172. For example, the MSP may compare the measured CDF data points to a reference version of the known CDF and derive the shift value from the comparison.

For a certain measured CDF data point <N,V>, the MSP may determine a reference voltage $V_{REF}$ in the reference CDF that would produce the same value of N. The offset can be estimated as $V-V_{REF}$. In some embodiments, the MSP may average the calculated shift over a number of CDF data points.

The MSP adjusts the read thresholds based on the estimated shift, at a threshold adjustment step 176. For example, when the reference CDF has a corresponding set of optimal thresholds (referred to as reference thresholds), the MSP can calculate the adjusted thresholds by subtracting the estimated shift from each of the reference thresholds.

The method of FIG. 10 assumes that the relative number of cells associated with each level is similar in the measured CDF and in the reference CDF. In practice, however, this condition may not always hold. Deviations from this condition may introduce inaccuracies into the shift estimation, and therefore into the read threshold positions.

The deviation can be corrected, for example, by storing the number of cells whose values are smaller than a given threshold when the cells are programmed. This stored number is denoted $N_{REC}$. When reading the cells, the MSP can use $N_{REC}$ to adjust the read thresholds to account for differences in the number of cells at each level.

The MSP can correct any read value (i.e., any value V in a measured CDF data point <N,V>) by calculating $V_{CORR}=V+CDF^{-1}(N)-CDF^{-1}(N+N_{REF}-N_{REC})$, where $V_{CORR}$ denotes the corrected value, V denotes the uncorrected value, and $N_{REF}$ denotes the number of cells in the reference CDF whose value is below $V_{CDF}$. The measured CDF data point <N,V> is typically chosen close to the data point in the reference CDF. The CDF correction technique above can also be used in any of the other CDF estimation methods described herein.

Alternatively, the MSP may use any other suitable technique for correcting errors caused by deviations in the number of cells associated with each programming level. For example, $N_{REC}$ may be calculated over only a subset of the cells. Typically, correcting a certain read threshold using the method above involves the use of the $N_{REC}$ values of all levels that are below the threshold in question. In the example of FIG. 1 above, correcting threshold TH3 uses the $N_{REC}$ values of the first three levels. In MLC devices in which different pages are mapped to different MLC bits using Gray-coded mapping, The $N_{REC}$ values may refer to numbers of cells that are associated with different memory pages, as described above.

Generally, the model-based methods described above may define the model based on a certain distribution of data values. The group of memory cells over which the CDF is estimated may have a different distribution of data values. In some cases, the group of memory cells for which the thresholds are adjusted may be different from the group of memory cells over which the CDF was estimated, and may have yet another distribution of data values. The MSP can correct the deviations caused by the different data value distributions using information regarding the actual distributions.

In MLC devices in which different memory pages are mapped to different MLC bits using Gray mapping, The MSP can estimate each read threshold separately, and at each stage process a single threshold. Alternatively, however, the MSP may use standard read commands that are commonly used in such memory devices. Many devices, for example, read a given CSB page with two thresholds in a single command. In such a case, the MSP may calculate a differential CDF, i.e., the number of cells whose storage values fall between the two read thresholds. If all levels were subjected to similar shifts, the differential CDF will not change substantially. If, however, different levels have different shifts, the differential CDF can be used to estimate the relative shift of one threshold with respect to the other. Having previously processed the LSB page, i.e., having found the absolute shift of one threshold, the MSP can estimate the absolute shift of other thresholds. Using this technique, the CDF estimation accuracy can be improved without a need to store the number of "1" bits in individual levels.

ECC-Assisted Threshold Adjustment

In some embodiments, the MSP encodes the data using an Error Correction Code (ECC) before storing the data in the memory cells. When retrieving data from the cells, the MSP decodes the ECC in order to correct reading errors. A reading error occurs when the storage value of a certain cell falls on the wrong side of a threshold, e.g., in a storage value interval that corresponds to an adjacent programming level.

For a given read error that was corrected by the ECC, the MSP can determine the direction of the error, i.e., the programming level with which the read storage value was erroneously associated before applying ECC correction. The MSP can use information regarding directions of corrected errors for adjusting the read thresholds.

For example, consider a read threshold that differentiates between two adjacent programming levels denoted L1 and L2. When the threshold is positioned properly, the number of errors in both directions around this threshold (i.e., the number of read values that fell in level L1 even though the cell was programmed to level L2, and the number of read values that fell in level L2 even though the cell was programmed to level L1) is expected to be similar. An asymmetry in the number of corrected errors of opposite directions may indicate a non-optimal threshold position. For example, if the number of read values that fell in level L1 even though the cell was programmed to level L2 is considerably greater than the number of errors in the opposite direction, the threshold should most likely be moved toward level L1.

Figure 11:
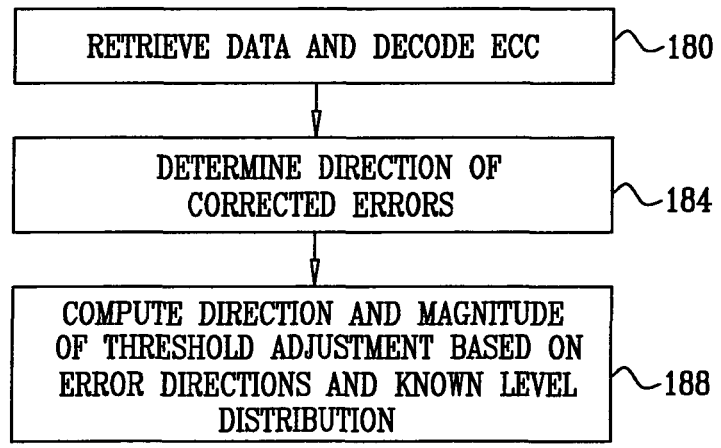

FIG. 11 is a flow chart that schematically illustrates a method for adjusting read thresholds, in accordance with an embodiment of the present invention. The method begins with the MSP retrieving ECC-encoded data from the cells and decoding the ECC, at a decoding step 180. The MSP classifies the errors corrected by the ECC into the different directions, at an error classification step 184. The MSP counts the number of errors in each class. For example, for a pair of levels denoted L1 and L2, the MSP counts the number of corrected errors directed from L1 to L2, and the number of corrected errors directed from L2 to L1. When level L1 corresponds to a "1" data bit and level L2 corresponds to a "0" data bit, the errors directed from L1 to L2 comprise the errors in which the ECC corrected a "0" into a "1", and the errors directed from L2 to L1 comprise the errors in which the ECC corrected a "1" into a "0".

(In MLC devices in which different pages are mapped to different MLC bits using Gray-coded mapping, the MSP typically uses the data read from lower-order pages in order to identify the errors in a given page. The MSP uses the data read from lower-order pages to identify the errors that correspond to a given pair of levels, and/or to determine the read threshold that should be adjusted based on such errors. Alternatively, the MSP may assume that all thresholds are subject to the same amount of shift.)

The MSP adjusts the read thresholds based on the numbers of corrected errors of the different directions, at a threshold adjustment step 188. Typically, the distribution (or CDF) of each level is known, and the MSP takes the known distributions into account when calculating the threshold adjustment.

Figure 12:
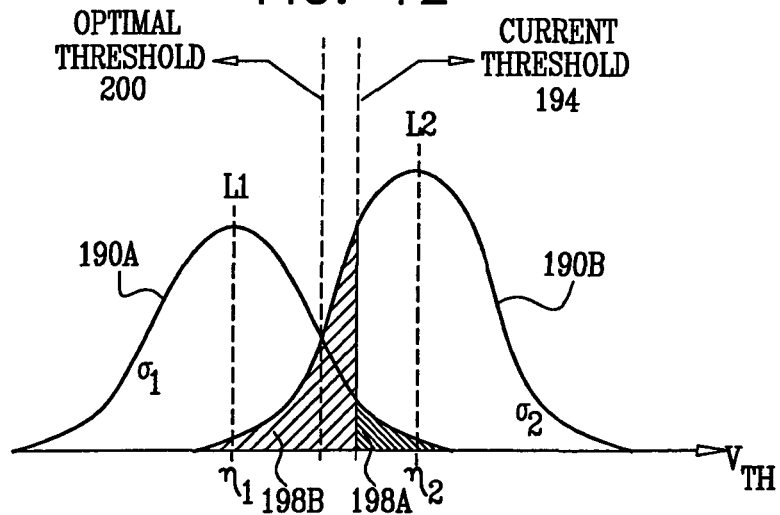
FIG. 12 is a graph showing threshold voltage distributions and read thresholds used in the method of FIG. 11, in accordance with an embodiment of the present invention.

FIG. 12 is a graph showing threshold voltage distributions and read thresholds used in the method of FIG. 11, in accordance with an embodiment of the present invention. In the present example, plots 190A and 190B show the storage value distributions of programming levels L1 and L2, respectively. The two distributions are assumed to be Gaussian having known means (denoted $\eta_1$ and $\eta_2$) and variances (denoted $\sigma_1$ and $\sigma_2$).

Initially, a current read threshold 194 differentiates between the two levels. When using threshold 194, the number of corrected errors directed from level L1 to level L2 is indicated by a region 198A. The number of corrected errors directed in the opposite direction, from level L2 to level L1, is indicated by a region 198B. As can be seen in the figure, the area of region 198B is considerably larger than the area of region 198A. Therefore, threshold 194 should be moved toward level L1. A Corrected read threshold 200 is positioned at the optimal value, which balances the numbers of corrected errors in both directions.

For Gaussian distributions, $\eta_1$ and $\eta_2$ can be estimated as $$\hat{\eta}_1 = t - \sigma_1 \cdot Q^{-1}\left(\frac{\text{"1"} \to \text{"0"}}{\text{total "1"}}\right)$$

$$\hat{\eta}_2 = t - \sigma_2 \cdot Q^{-1}\left(\frac{\text{"0"} \to \text{"1"}}{\text{total "0"}}\right)$$

wherein t denotes the value of threshold 194, "1"→"0" denotes the number of bits that the ECC decoder changed from "1" to "0", "0"→"1" denotes the number of bits that decoder changed from "0" to "1", total "1" denotes the total number of "1" bits after ECC correction, and total "0" denotes the total number of "0" bits after ECC correction.

The optimal threshold value x (i.e., the value of threshold 200) is a solution of $ax^2+bx+c=0$, wherein $$a = \sigma_2^2 - \sigma_1^2$$

$$b = 2(\sigma_1^2\eta_2 - \sigma_2^2\eta_1)$$

$$c = \sigma_2^2\eta_1^2 - \sigma_1^2\eta_2^2 - 2\sigma_1^2\sigma_2^2\log\left(\frac{\sigma_2}{\sigma_1}\right)$$

Thus, x is given by $$x_{1,2} = \frac{(\sigma_2^2\eta_1 - \sigma_1^2\eta_2) \pm \sigma_1\sigma_2\sqrt{(\eta_1 - \eta_2)^2 - 2(\sigma_2^2 - \sigma_1^2)\log\left(\frac{\sigma_2}{\sigma_1}\right)}}{(\sigma_2^2 - \sigma_1^2)}$$

Alternatively, the midpoint between the two means $\eta_1$ and $\eta_2$ can be used as a reference point. The shift of the optimal threshold with respect to the midpoint can be calculated by $$\text{shift} = \frac{\sigma_2}{2} \cdot Q^{-1}\left(\frac{\text{"0"} \to \text{"1"}}{\text{total "0"}}\right) - \frac{\sigma_1}{2} \cdot Q^{-1}\left(\frac{\text{"1"} \to \text{"0"}}{\text{total "1"}}\right)$$

The latter method can also be used with non-Gaussian distributions.

The description of FIGS. 11 and 12 addresses two programming levels. In MLC devices in which different pages are mapped to different bits, the MSP may examine a specific page, and determine the appropriate programming levels using the data read from the other pages mapped to the same group of memory cells. For example, the programming levels applicable to the CSB page can be determined based on the data read from the LSB page. The programming levels applicable to the MSB page can be determined based on the data read from the LSB and CSB pages. The LSB page can be processed independently of the other pages.

For asymmetric distributions (e.g., in the Gaussian case when $\sigma_1 \neq \sigma_2$), the number of corrected errors directed from level L1 to level L2 may differ from the number of errors in the opposite direction, even when the read threshold is set to the optimal position. In the Gaussian case, the formulas given above handle this situation and nevertheless provide the optimal threshold position.

Threshold Acquisition and Tracking

The different threshold estimation methods described herein can be used with different levels of a-priori uncertainty as to the optimal threshold locations. These scenarios can be roughly classified as threshold acquisition and threshold tracking scenarios. In threshold acquisition, the currently-used read thresholds are very far from optimal. Acquisition scenarios occur, for example, after power-up or following a long period in which the thresholds were not adapted. In threshold tracking, on the other hand, the thresholds that are currently in use have relatively small deviations from the optimal positions. Tracking scenarios occur, for example, when the MSP continually estimates and adjusts the threshold positions to track gradual changes in the memory device.

The methods of FIGS. 8-10, for example, are particularly suitable for threshold acquisition, although they can also be used for tracking. The methods of FIGS. 11 and 12, on the other hand, are particularly suitable for threshold tracking, although they can also be used for threshold acquisition. Typically but not necessarily, the techniques that are based on ECC assistance and on counting the number of "1" or "0" bits are best suited for threshold tracking.

Intra-Page and Inter-Page Threshold Estimation

In some embodiments, the threshold estimation methods described herein are used for adjusting the read thresholds within a certain page. In these implementations, the measurements and computations are performed over the memory cells of a certain page, and the results are used for adjusting the thresholds of the same page. Such a configuration is referred to as intra-page threshold estimation. In alternative embodiments, the measurements and computations are performed over a certain page, and the results are used to adjust the thresholds of a different page. Such a configuration is referred to as inter-page threshold estimation. (Although the description that follows refers to memory pages, the methods described herein are similarly applicable to any other suitable groups of memory cells.)

When carrying out inter-page estimation, the source page (i.e., the page over which the measurements are performed) and the target page (the page whose thresholds are modified) sometimes have different data characteristics, which may affect the optimal threshold positions. In some embodiments, the MSP adapts the threshold adjustment to the specific characteristics of the target page. For example, for each page and for a given read threshold value, the MSP may store the number of cells in the page whose storage values are below the threshold. The MSP can then correct the threshold adjustment using this characteristic of the target page. A similar correction can be applied in intra-page operation, as well.

The threshold correction can be written as $\Delta=F(N-N_{RECORDED})$, wherein N denotes the measured number of cells that are below the threshold, and $N_{RECORDED}$ denotes the number that is stored along with the page. A more elaborated correction factor may include information from multiple thresholds, e.g., $\Delta=F(N1-N1_{RECORDED}, N2-N2_{RECORDED}, N3-N3_{RECORDED}, \ldots)$.

Consider, for example, a 3 bit/cell memory. Each cell stores three data bits denoted LSB, CSB and USB in a Gray-coded mapping. Within a certain word line, the cell LSBs store a certain page, the USBs store another page and the MSBs store a third page. At a certain point in time, the LSB and USB pages are already retrieved and their read thresholds are set. Thus, the MSP has three threshold offsets—one for the LSB and two for the USB. The MSP can use the three offsets for calculating the read threshold adjustment of the MSB page.

Additionally or alternatively, threshold adjustment information can be used between different word lines, different erasure blocks, different planes, different dies originating from a certain wafer, and/or between any other suitable groups of cells.

For example, the threshold correction may vary from one word line to the next in accordance with a certain dependence that can be estimated and tracked. As another example, the threshold correction in odd and even pages in a certain word line may be correlative.

In another scenario, certain word lines within a block may exhibit different threshold behavior. For example, in a 32-line erasure block, word lines 0 to 4 may exhibit large threshold variation between word lines, word lines 5-25 may exhibit little or no variation, and word lines 26-31 may again exhibit large variations. The MSP can take these characteristics into account by restricting the allowed variations between word lines 5-25, and allowing large changes between the other word lines.

Additionally or alternatively to using the number of cells that fall below a given threshold in each page, the MSP may record and use information regarding errors that were corrected by the ECC in each page in order to correct the read threshold adjustment between pages. Further additionally or alternatively, the MSP may correct the thresholds between different pages based on the number of "1" bits and/or the "0" bits in the page. (When Gray mapping is used, the number of "1" bits in a page equals the number of cells that is associated with a set of programming levels.) These counts can be stored, for example, when the page is programmed.

Although the embodiments described herein mainly address data storage and retrieval in solid-state memory devices, the principles of the present invention can also be used for storing and retrieving data in Hard Disk Drives (HDD) and other data storage media and devices.

Although the embodiments described herein mainly refer to estimation and adaptation of read thresholds, the methods described herein can be similarly be used to compute other types of thresholds used for processing the storage values in analog memory cells, such as programming thresholds and verification thresholds.

Certain additional aspects of threshold estimation and adaptation are described in PCT Application WO 2007/132457, entitled "Combined Distortion Estimation and Error Correction Coding for Memory Devices," filed May 10, 2007, PCT Application WO 2007/132453, entitled "Distortion Estimation and Cancellation in Memory Devices," cited above, and PCT Application PCT/IL2007/001315, entitled "Reading Memory Cells using Multiple Thresholds," filed Oct. 30, 2007, whose disclosures are incorporated herein by reference.

In some embodiments, the MSP reads a given group of memory cells (e.g., a page) using multiple read thresholds. In some of these embodiments, the data is encoded with an ECC before it is stored in the memory cells. The MSP computes soft decoding metrics based on the multiple read results, and decodes the ECC using the metrics. The threshold estimation and adjustment methods described herein can be used to determine the values of the multiple read thresholds used for producing the soft decoding metrics. Using the methods and systems described herein, the number of read operations performed on each group of memory cells can be reduced.

In some embodiments, the MSP estimates and cancels distortion that is present in the storage values read from the memory cells. In these embodiments, the MSP may position the read thresholds used for reading the cells using the methods and systems described herein, so as to reduce the number of read operations.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes a plurality of analog memory cells, comprising:
   storing data in the memory by writing first storage values to the cells;
   reading second storage values from the cells and estimating a Cumulative Distribution Function (CDF) of the second storage values;
   processing the estimated CDF so as to compute one or more thresholds; and
   performing a memory access operation on the cells using the one or more thresholds,
   wherein processing the estimated CDF comprises defining a model that produces a target CDF responsively to input parameters, adapting the model by fitting the target CDF to the estimated CDF, and computing the thresholds based on the adapted model.

2. The method according to claim 1, wherein estimating the CDF comprises computing one or more CDF data points, such that a CDF data point that corresponds to a given storage value is indicative of one of:
   a number of the second storage values that do not exceed the given storage value; and
   a number of the second storage values that exceed the given storage value.

3. The method according to claim 1, wherein the first storage values are selected from a set of nominal values that program the cells to assume respective programming states, and wherein the input parameters comprise at least one parameter selected from a group of parameters consisting of:
   a widening factor of a distribution of a subset of the second storage values associated with one of the programming states;
   a variance of the distribution of the subset of the second storage values associated with the one of the programming states;
   a relative shift of the distribution of the subset of the second storage values associated with the one of the programming states; and
   a mean of the distribution of the subset of the second storage values associated with the one of the programming states.

4. The method according to claim 1, wherein defining the model comprises predefining a plurality of target CDFs, and wherein fitting the target CDF to the estimated CDF comprises selecting a predefined target CDF from the plurality responsively to the estimated CDF.

5. The method according to claim 1, wherein the first storage values are selected from a set of nominal values that program the cells to assume respective programming states, wherein the second storage values that are associated with a given programming state are distributed in accordance with a known function of a subset of the input parameters, and wherein adapting the model comprises estimating the subset of the input parameters irrespective of programming states other than the given programming state.

6. The method according to claim 1, wherein the first storage values are selected from a set of nominal values that program the cells to assume respective programming states, wherein the model is defined based on a first distribution of the memory cells among the programming states, wherein the CDF is estimated based on a second distribution of the memory cells among the programming states that is different from the first distribution, and wherein adapting the model comprises correcting an error in the target CDF caused by a difference between the first and second distributions.

7. The method according to claim 6, wherein storing the data comprises storing information regarding the first distribution in the memory, and wherein correcting the error comprises retrieving the stored information and correcting the error responsively to the retrieved information.

8. A method for operating a memory that includes a plurality of analog memory cells, comprising:
storing data in the memory by writing first storage values to the cells;
reading second storage values from the cells and estimating a Cumulative Distribution Function (CDF) of the second storage values;
processing the estimated CDF so as to compute one or more thresholds; and
performing a memory access operation on the cells using the one or more thresholds,
wherein the first storage values are selected from a set of nominal values that program the cells to assume respective programming states, wherein the second storage values corresponding to each of the programming states are distributed in accordance with respective distributions, and wherein estimating the CDF comprises scaling the distributions in accordance with numbers of the second storage values that correspond to the respective programming states, and estimating the CDF responsively to the scaled distributions.

9. A method for operating a memory that includes a plurality of analog memory cells, comprising:
storing data in the memory by writing first storage values to the cells;
reading second storage values from the cells and estimating a Cumulative Distribution Function (CDF) of the second storage values;
processing the estimated CDF so as to compute one or more thresholds; and
performing a memory access operation on the cells using the one or more thresholds,
wherein processing the estimated CDF comprises identifying a flat region in the estimated CDF and positioning at least one of the thresholds within the flat region.

10. A method for operating a memory that includes a plurality of analog memory cells, comprising:
storing data in the memory by writing first storage values to the cells;
reading second storage values from the cells and estimating a Cumulative Distribution Function (CDF) of the second storage values;
processing the estimated CDF so as to compute one or more thresholds; and
performing a memory access operation on the cells using the one or more thresholds,
wherein the CDF has a known shape within at least a partial range of the second storage values, wherein the estimated CDF has a shift with respect to the CDF, and wherein processing the estimated CDF comprises calculating the shift and computing the thresholds responsively to the calculated shift.

11. The method according to claim 10, wherein estimating the CDF comprises measuring one or more values of the CDF in respective one or more of the second storage values that are located in the partial range of the second storage values, and determining the shift based on the measured values of the CDF.

12. The method according to claim 10, wherein computing the thresholds comprises shifting the thresholds with the calculated shift.

13. A method for operating a memory that includes a plurality of analog memory cells, comprising:
storing data in the memory by writing first storage values to the cells;
reading second storage values from the cells and estimating a Cumulative Distribution Function (CDF) of the second storage values;
processing the estimated CDF so as to compute one or more thresholds; and
performing a memory access operation on the cells using the one or more thresholds,
wherein the first storage values are selected from a set of nominal values that program the cells to assume respective programming states, wherein the second storage values fall in a set of storage value ranges that correspond to the programming states, and wherein estimating the CDF comprises measuring at least one value of the CDF within the storage value ranges.

14. A method for operating a memory that includes a plurality of analog memory cells, comprising:
storing data in the memory by writing first storage values to the cells;
reading second storage values from the cells and estimating a Cumulative Distribution Function (CDF) of the second storage values;
processing the estimated CDF so as to compute one or more thresholds; and
performing a memory access operation on the cells using the one or more thresholds,
wherein reading the second storage values comprises reading the second storage values from a first group of the memory cells, and wherein performing the memory access operation comprises performing the memory access operation on a second group of the memory cells, different from the first group, using the one or more thresholds.

15. The method according to claim 14, wherein the data stored in the first and second groups have first and second data value distributions that are different from one another, and comprising adjusting the thresholds to match the second data value distribution.

16. The method according to claim 14, and comprising determining a dependence of optimal threshold positions in the second group on the optimal threshold positions in the first group, and adjusting the thresholds for performing the memory access operation in the second group in accordance with the dependence.

17. A method for operating a memory that includes a plurality of analog memory cells, comprising:
storing data in the memory by writing first storage values to the cells;
reading second storage values from the cells and estimating a Cumulative Distribution Function (CDF) of the second storage values;

processing the estimated CDF so as to compute one or more thresholds; and performing a memory access operation on the cells using the one or more thresholds, wherein the one or more thresholds comprise read thresholds, and wherein performing the memory access operation comprises reading third storage values from the cells using the read thresholds, so as to reconstruct the stored data.

18. The method according to claim 17, wherein storing the data comprises encoding the data with an Error Correction Code (ECC), wherein reading the third storage values comprises decoding the ECC and determining errors that were corrected by the ECC, and comprising adjusting the read thresholds responsively to the corrected errors.

19. The method according to claim 18, wherein, for a given read threshold, determining the corrected errors comprises determining a first number of the errors caused by the third storage values falling below the given read threshold and a second number of the errors caused by the third storage values falling above the given read threshold, and wherein adjusting the read thresholds comprises adjusting the given read threshold responsively to the first and second numbers.

20. The method according to claim 17, wherein reading the third storage values further comprises canceling a distortion in one or more of the third storage values.

21. A method for operating a memory that includes a plurality of analog memory cells, comprising:

storing data in the memory by writing first storage values to the cells;

reading second storage values from the cells and estimating a Cumulative Distribution Function (CDF) of the second storage values;

processing the estimated CDF so as to compute one or more thresholds; and performing a memory access operation on the cells using the one or more thresholds, wherein the thresholds comprise verification thresholds, and wherein performing the memory access operation comprises verifying the first storage values written to the cells using the verification thresholds.

22. A method for operating a memory that includes a plurality of analog memory cells, comprising:

storing data in the memory by writing first storage values to the cells;

reading second storage values from the cells and estimating a Cumulative Distribution Function (CDF) of the second storage values;

processing the estimated CDF so as to compute one or more thresholds; and performing a memory access operation on the cells using the one or more thresholds, wherein storing the data comprises encoding the data with an Error Correction Code (ECC), wherein the one or more thresholds comprise multiple sets of read thresholds, and wherein performing the memory access operation comprises reading multiple sets of third storage values from the cells using the respective multiple sets of the read thresholds, computing soft decoding metrics responsively to the multiple sets of the third storage values, and decoding the ECC using the soft decoding metrics, so as to reconstruct the data.

23. A method for operating a memory that includes a plurality of analog memory cells, comprising:

storing data in the memory by writing first storage values to the cells;

reading second storage values from the cells and estimating a Cumulative Distribution Function (CDF) of the second storage values;

processing the estimated CDF so as to compute one or more thresholds; and performing a memory access operation on the cells using the one or more thresholds, wherein each of the memory cells stores multiple data bits, wherein storing the data comprises storing multiple memory pages in the respective multiple data bits of the memory cells, and wherein performing the memory access operation comprises reading each of the memory pages using a subset of the thresholds.

24. A data storage apparatus, comprising:

an interface, which is operative to communicate with a memory that includes a plurality of analog memory cells; and a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds, wherein the processor is coupled to define a model that produces a target CDF responsively to input parameters, to adapt the model by fitting the target CDF to the estimated CDF, and to compute the thresholds based on the adapted model.

25. The apparatus according to claim 24, wherein the processor is coupled to estimate the CDF by computing one or more CDF data points, such that a CDF data point that corresponds to a given storage value is indicative of one of:

a number of the second storage values that do not exceed the given storage value; and a number of the second storage values that exceed the given storage value.

26. The apparatus according to claim 24, wherein the processor is coupled to select the first storage values from a set of nominal values so as to program the cells to assume respective programming states, and wherein the input parameters comprise at least one parameter selected from a group of parameters consisting of:

a widening factor of a distribution of a subset of the second storage values associated with one of the programming states;

a variance of the distribution of the subset of the second storage values associated with the one of the programming states;

a relative shift of the distribution of the subset of the second storage values associated with the one of the programming states; and a mean of the distribution of the subset of the second storage values associated with the one of the programming states.

27. The apparatus according to claim 24, wherein the processor is coupled to predefine a plurality of target CDFs, and to select a predefined target CDF from the plurality responsively to the estimated CDF.

28. The apparatus according to claim 24, wherein the first storage values are selected from a set of nominal values that program the cells to assume respective programming states, wherein the second storage values that are associated with a given programming state are distributed in accordance with a known function of a subset of the input parameters, and wherein the processor is coupled to adapt the model by estimating the subset of the input parameters irrespective of programming states other than the given programming state.

29. The apparatus according to claim 24, wherein the processor is coupled to select the first storage values from a set of nominal values so as to program the cells to assume respective programming states, to define the model based on a first distribution of the memory cells among the programming states, to estimate the CDF based on a second distribution of the memory cells among the programming states that is different from the first distribution, and to correct an error in the target CDF caused by a difference between the first and second distributions.

30. The apparatus according to claim 29, wherein the processor is coupled to store information regarding the first distribution in the memory, to retrieve the stored information and to correct the error responsively to the retrieved information.

31. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the first storage values are selected from a set of nominal values that program the cells to assume respective programming states, wherein the second storage values corresponding to each of the programming states are distributed in accordance with respective distributions, and wherein the processor is coupled to scale the distributions in accordance with numbers of the second storage values that correspond to the respective programming states, and to estimate the CDF responsively to the scaled distributions.

32. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the processor is coupled to identify a flat region in the estimated CDF and to position at least one of the thresholds within the flat region.

33. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the CDF has a known shape within at least a partial range of the second storage values, wherein the estimated CDF has a shift with respect to the CDF, and wherein the processor is coupled to calculate the shift and to compute the thresholds responsively to the calculated shift.

34. The apparatus according to claim 33, wherein the processor is coupled to measure one or more values of the CDF in respective one or more of the second storage values that are located in the partial range of the second storage values, and to determine the shift based on the measured values of the CDF.

35. The apparatus according to claim 33, wherein the processor is coupled to shift the thresholds with the calculated shift.

36. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the first storage values are selected from a set of nominal values that program the cells to assume respective programming states, wherein the second storage values fall in a set of storage value ranges that correspond to the programming states, and wherein the processor is coupled to estimate at least one value of the CDF within the storage value ranges.

37. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the processor is coupled to read the second storage values from a first group of the memory cells, and to perform the memory access operation on a second group of the memory cells, different from the first group, using the one or more thresholds.

38. The apparatus according to claim 37, wherein the data stored in the first and second groups have first and second data value distributions that are different from one another, and wherein the processor is coupled to adjust the thresholds to match the second data value distribution.

39. The apparatus according to claim 37, wherein the processor is coupled to determine a dependence of optimal threshold positions in the second group on the optimal threshold positions in the first group, and to adjust the thresholds for performing the memory access operation in the second group in accordance with the dependence.

40. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds, wherein the one or more thresholds comprise read thresholds, and wherein the processor is coupled to read third storage values from the cells using the read thresholds, so as to reconstruct the stored data.

41. The apparatus according to claim 40, wherein the processor is coupled to encode the data with an Error Correction Code (ECC), to decode the ECC when reconstructing the data, to determine errors that were corrected by the ECC, and to adjust the read thresholds responsively to the corrected errors.

42. The apparatus according to claim 41, wherein, for a given read threshold, the processor is coupled to determine a first number of the errors caused by the third storage values falling below the given read threshold and a second number of the errors caused by the third storage values falling above the given read threshold, and to adjust the given read threshold responsively to the first and second numbers.

43. The apparatus according to claim 40, wherein the processor is coupled to cancel a distortion in one or more of the read third storage values.

44. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the thresholds comprise verification thresholds, and wherein the processor is coupled to verify the first storage values written to the cells using the verification thresholds.

45. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the stored data is encoded with an Error Correction Code (ECC), wherein the one or more thresholds comprise multiple sets of read thresholds, and wherein the processor is coupled to read multiple sets of third storage values from the cells using the respective multiple sets of the read thresholds, to compute soft decoding metrics responsively to the multiple sets of the third storage values, and to decode the ECC using the soft decoding metrics, so as to reconstruct the data.

46. A data storage apparatus, comprising:
an interface, which is operative to communicate with a memory that includes a plurality of analog memory cells; and
a processor, which is connected to the interface and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein each of the memory cells stores multiple data bits, and wherein the processor is coupled to store multiple memory pages in the respective multiple data bits of the memory cells, and to read each of the memory pages using a subset of the thresholds.

47. A data storage apparatus, comprising:
a memory, which comprises a plurality of analog memory cells; and
a processor, which is connected to the memory and is coupled to store data in the memory by writing first storage values to the cells, to read second storage values from the cells, to estimate a Cumulative Distribution Function (CDF) of the second storage values, to process the estimated CDF so as to compute one or more thresholds, and to perform a memory access operation on the cells using the one or more thresholds,
wherein the processor is coupled to define a model that produces a target CDF responsively to input parameters, to adapt the model by fitting the target CDF to the estimated CDF, and to compute the thresholds based on the adapted model.

\* \* \* \* \*